United States Patent
Mishra (10) Patent No.: US 7,164,370 B1
(45) Date of Patent: Jan. 16, 2007

(54) SYSTEM AND METHOD FOR DECODING DATA COMPRESSED IN ACCORDANCE WITH DICTIONARY-BASED COMPRESSION SCHEMES

(75) Inventor: Rajesh Mishra, Newton, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 11/245,320

(22) Filed: Oct. 6, 2005

(51) Int. Cl.
  *H03M 7/34* (2006.01)
(52) U.S. Cl. .......................................... 341/51; 341/50
(58) Field of Classification Search ............. 341/50–90
  See application file for complete search history.

(56) References Cited

U.S. PATENT DOCUMENTS

| | | |
|---|---|---|
| 4,054,951 A | 10/1977 | Jackson et al. |
| 4,464,650 A | 8/1984 | Eastman et al. |
| 4,558,302 A | 12/1985 | Welch |
| 5,058,144 A | 10/1991 | Fiala et al. |
| 5,153,591 A | 10/1992 | Clark |
| 5,243,341 A | 9/1993 | Seroussi et al. |
| 5,414,425 A | 5/1995 | Whiting et al. |
| 5,463,390 A | 10/1995 | Whiting et al. |
| 5,485,526 A | 1/1996 | Tobin |
| 5,506,580 A | 4/1996 | Whiting et al. |
| 6,215,906 B1 * | 4/2001 | Okada ........................ 382/239 |
| 6,218,970 B1 * | 4/2001 | Jaquette ........................ 341/51 |
| 6,404,362 B1 | 6/2002 | York et al. |

OTHER PUBLICATIONS

T. Welch, "A Technique for High-Performance Data Compression," IEEE Computer, vol. 17, No. 6, Jun. 1984.

* cited by examiner

*Primary Examiner*—Lam T. Mai
(74) *Attorney, Agent, or Firm*—Gauthier & Connors LLP (57) ABSTRACT

A method is disclosed for decoding a coded input stream and producing a decoded output stream. The method includes the steps of assigning each successive code in the input stream a dictionary definition that references a location in an output stream, and providing literal codes and reference codes to an output memory such that the reference codes include a source address in the output stream and a length of a code at the source address.

18 Claims, 10 Drawing Sheets

FIG. 1
Prior Art

Coded Input String:
A<SPACE>MAN<SPACE>[256]PL[259][261]<SPACE>C[259]AL<SPACE>P[269][258]

Decoded Output String:
A<SPACE>MAN<SPACE>A<SPACE>PLAN<SPACE>A<SPACE>CANAL<SPACE>PANAMA

| Input Code | Output String | New Entry (Prefix,Suffix) |
|---|---|---|
| A | A | |
| <SPACE> | <SPACE> | 256=(A,<SPACE>) |
| M | M | 257=(<SPACE>,M) |
| A | A | 258=(M,A) |
| N | N | 259=(A,N) |
| <SPACE> | <SPACE> | 260=(N,<SPACE>) |
| 256 | A<SPACE> | 261=(<SPACE>,A) |
| P | P | 262=(256,P) |
| L | L | 263=(P,L) |
| <259> | AN | 264=(L,A) |
| <261> | <SPACE>A | 265=(259,<SPACE>) |
| <SPACE> | <SPACE> | 266=(261,<SPACE>) |
| C | C | 267=(<SPACE>,C) |
| <259> | AN | 268=(C,A) |
| A | A | 269=(259,A) |
| L | L | 270=(A,L) |
| <SPACE> | <SPACE> | 271=(L,<SPACE>) |
| P | P | 272=(<SPACE>,P) |
| <269> | ANA | 273=(P,A) |
| <258> | MA | 274=(269,M) |

Coded Input String:

A<SPACE>MAN<SPACE>[256]PL[259][261]<SPACE>C[259]AL<SPACE>P[269][258]

FIG. 4A

Decoded Output Spring:

A<SPACE>MAN<SPACE>A<SPACE>PLAN<SPACE>A<SPACE>CANAL<SPACE>PANAMA

FIG. 4C

| Input Code | Output Operation ||| New Entry (Addr,Len) |
|---|---|---|---|---|
| | Source Address | Target Address | Length | |
| A | - | 0 | 1 | 256=(0,2) |
| <SPACE> | - | 1 | 1 | 257=(1,2) |
| M | - | 2 | 1 | 258=(2,2) |
| A | - | 3 | 1 | 259=(3,2) |
| N | - | 4 | 1 | 260=(4,2) |
| <SPACE> | 0 | 5 | 1 | 261=(5,2) |
| 256 | - | 6 | 2 | 262=(6,3) |
| P | - | 8 | 1 | 263=(8,2) |
| L | - | 9 | 1 | 264=(9,2) |
| <259> | 3 | 10 | 2 | 265=(10,3) |
| <261> | 5 | 12 | 2 | 266=(12,3) |
| <SPACE> | - | 14 | 1 | 267=(14,2) |
| C | - | 15 | 1 | 268=(15,2) |
| <259> | 3 | 16 | 2 | 269=(16,3) |
| A | - | 18 | 1 | 270=(18,2) |
| L | - | 19 | 1 | 271=(19,2) |
| <SPACE> | - | 20 | 1 | 272=(20,2) |
| P | - | 21 | 1 | 273=(21,3) |
| <269> | 16 | 22 | 3 | 274=(22,4) |
| <258> | 2 | 25 | 2 | |

FIG. 4B

| Input Code | Output Operation ||| New Entry (Addr,Len) |
| --- | --- | --- | --- | --- |
| | Source Address | Target Address | Length | |
| A | – | 0 | 1 | – |
| <SPACE> | – | 1 | 1 | – |
| M | – | 2 | 1 | – |
| [0,1,N] | 0 | 3 | 1 | – |
| [0,1,A] | 1 | 5 | 1 | – |
| [1,1,P] | 1 | 7 | 1 | – |
| L | – | 9 | 1 | – |
| [3,2,<SPACE>] | 3 | 10 | 2 | – |
| [0,2,C] | 0 | 13 | 2 | – |
| [3,2,A] | 3 | 16 | 2 | – |
| [9,1,<SPACE>] | 9 | 19 | 1 | – |
| [8,1,A] | 8 | 21 | 1 | – |
| [17,2,M] | 17 | 23 | 2 | – |
| A | – | 26 | 1 | – |

FIG. 5B

| Input Code | Output Operation ||| New Entry (Addr,Len) |
| | Source Address | Target Address | Length | |
|---|---|---|---|---|
| A | – | 0 | 1 | – |
| <SPACE> | – | 1 | 1 | – |
| M | – | 2 | 1 | – |
| A | – | 3 | 1 | – |
| N | – | 4 | 1 | – |
| <SPACE> | 0 | 5 | 1 | – |
| [10:2] | – | 6 | 2 | – |
| P | – | 8 | 1 | – |
| L | 3 | 9 | 5 | – |
| [9:5] | – | 10 | 1 | – |
| C | 3 | 15 | 2 | – |
| [3:2] | – | 16 | 1 | – |
| A | – | 18 | 1 | – |
| L | 7 | 19 | 2 | – |
| [3:2] | 16 | 20 | 3 | – |
| [10:3] | – | 22 | 2 | – |
| M | – | 25 | 3 | – |
| A | – | 26 | 1 | – |

FIG. 6B

SYSTEM AND METHOD FOR DECODING DATA COMPRESSED IN ACCORDANCE WITH DICTIONARY-BASED COMPRESSION SCHEMES

BACKGROUND

The invention generally relates to data encoding/decoding systems for use with dictionary-based encoding/decoding systems.

Dictionary-based encoding systems typically involve an encoding algorithm for encoding an input stream that avoids duplication by producing an encoded stream that assigns codes to input strings that are repeated in the input stream. The decoding system typically applies the same algorithm in the reverse order to decode the encoded stream to provide a decoded output stream. Conventional dictionary-based decoding systems need to know the specific algorithm by which the input stream was encoded by the encoding system.

For example, U.S. Pat. No. 4,054,951 discloses a data encoding/decoding algorithm that involves assigning a five-part tag for each section of encoded data (flag, start, address, length, repetition). U.S. Pat. Nos. 5,414,425; 5,463,390; and 5,506,580 disclose encoding/decoding algorithms that use a three-part tag (flag, pointer, length). These systems, however, generally require the use of a history buffer as the dictionary.

U.S. Pat. No. 4,558,302 discloses an encoding algorithm that requires maintenance of a two part tag (prefix, extension character). The complementary decoding system traverses the linked list of prefixes to output the decoded stream. U.S. Pat. No. 4,464,650 discloses a system that employs a similar encoding/decoding algorithm, and further discloses the use of a tree during the decoding process. Each of these systems, however, requires that the decoding system know the algorithm by which the encoded stream was developed by the encoding system.

Figure 1:
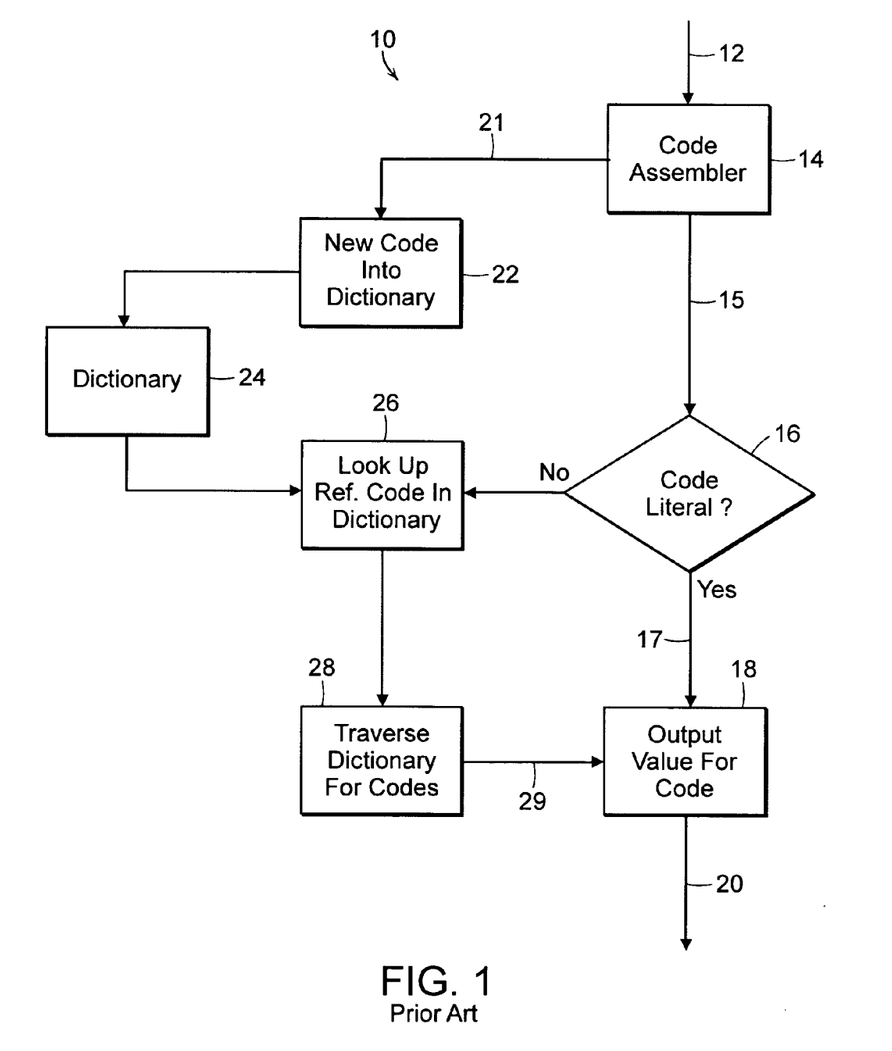
FIG. 1 shows an illustrative diagrammatic functional view of a decoding system of the prior art.

For example, FIG. 1 shows a prior art dictionary-based decoder system 10 in which an input stream 12 is received by a code assembler (step 14). The code assembly 14 provides a reference code 15, and if the reference code is a literal code (step 16), then the literal code 17 is output (step 18) to an output stream 20. A reference code is a code that implicitly encodes a string of output values by referencing previous literal and/or reference codes. A literal code is a code that explicitly encodes a fixed string of output values. The code assembler (step 14) also outputs data 21 to a dictionary routine. The data 21 includes the previous code as well as the first character of the current code. The dictionary routine inserts the new code into the dictionary (step 22), and the dictionary is updated (step 24). The routine then looks up the reference code in the dictionary, and advances the current code to the new code (step 26). The dictionary is then traversed for all literal codes (step 28), and the literal codes 29 are the output (step 18) to the output stream 20. Reference codes that 15 that are not literal codes (step 16) are passed to the dictionary routine to look up the reference code in the dictionary and to advance the current code to the new code (step 26). The dictionary is then traversed for all literal codes (step 28) and the literal code is then output (step 18) to the output stream 20.

Figure 2A:
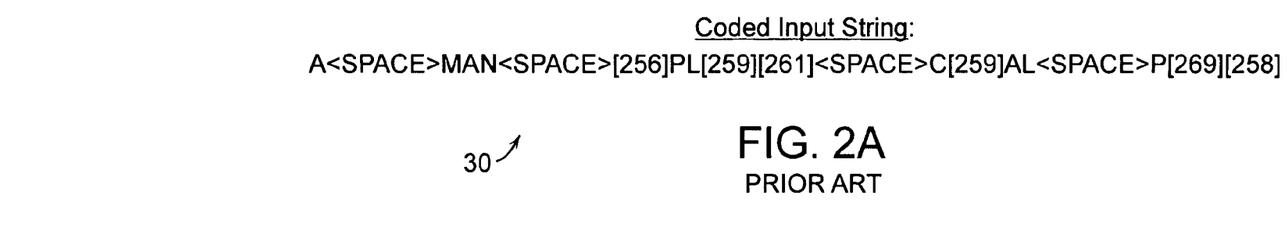
FIGS. 2A–2C show illustrative diagrammatic views of an example of an input code being decoded by the system of FIG. 1.
Figure 2B:
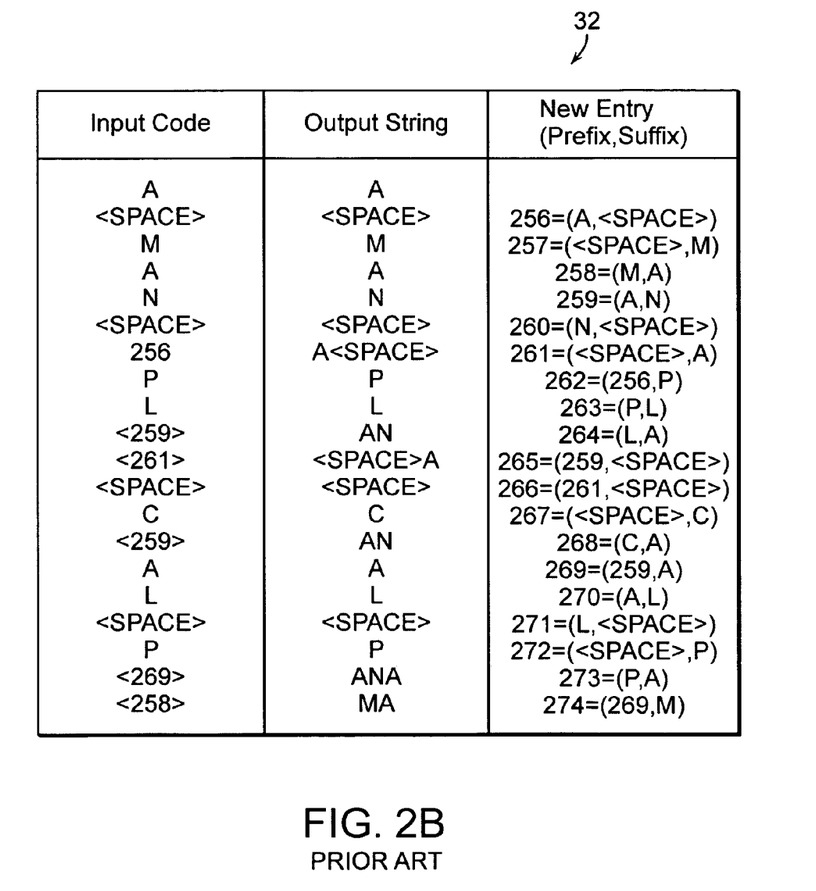
Figure 2C:
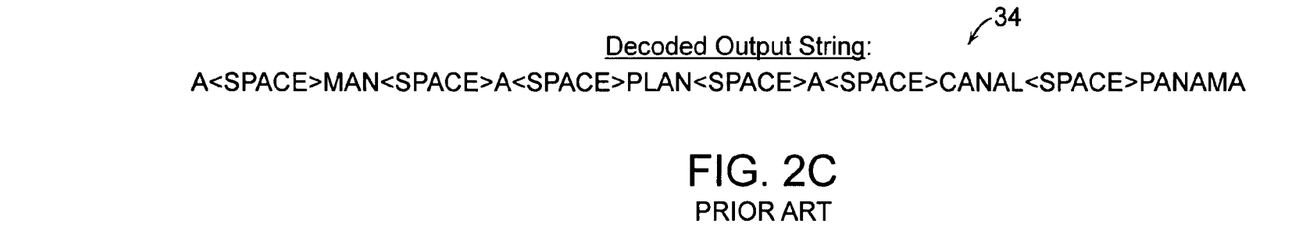

As an example, FIG. 2A shows at 30 a coded input string for text for illustrative purposes. FIG. 2B shows at 32 a table of each input code, each associated output string, and each associated new entry consisting of a prefix and a suffix. In particular, the first reference code is an A, which is provided to the output string. The next reference code is a space, and a definition is created for the pair (A,<SPACE>). This definition is given a unique name (e.g., 256). Subsequent pairs are given unique names (e.g., 257–261). When a reference code is encountered in the input string (e.g., 256), the system records a code (262) that is defined as the prefix being 256 and the extension character P. In this fashion, the output string (as shown at 34 in FIG. 2C) is developed using by traversing the linked list, which may include many embedded references. The more compressed the code, however, the longer it will take to traverse the linked list.

U.S. Pat. No. 5,058,144 discloses an encoding/decoding system that requires encoding a search tree that is used by the decoding system to output decoded symbols. The decoding process requires traversal of this tree. U.S. Pat. No. 5,153,591 discloses an encoding/decoding system that also requires the use of a search tree in the decoding system, and U.S. Pat. No. 5,243,341 discloses an encoding/decoding system that employs a second dictionary to preserve information prior to reset of the first dictionary.

U.S. Pat. No. 6,404,362 discloses an encoding/decoding system that seeks to eliminate the need to traverse data structures during decoding of an encoded input stream that uses a self-building dictionary. In particular, a dictionary of a structure with prefix string code and extension characters is stored, together with a fast or finder memory that contains address and lengths of all sub-strings that have been encountered in the input stream. The decoding system first looks up the finder memory for a fast search for all blocks of string memory that may be easily copied. If this search fails, the decoder builds a new sub-string from the dictionary, and outputs this sub-string to the output buffer. The system also inserts this address and length into the finder memory, and employs a separate variable-length string memory to access blocks of sub-string data.

There is a need, therefore, for a decoding system for dictionary-based encoding/decoding systems that more efficiently and economically provides decoding of dictionary-based encoded data.

Further, there is a need for such a decoding system for dictionary-based encoding/decoding systems that does not require the use of complex structures such as search trees, history buffers, or second dictionaries.

There is further a need for a decoding system for dictionary-based encoding/decoding systems that does not require the use of a traditional dictionary that consists of prefix and extension codes.

SUMMARY

In accordance with an embodiment, the invention provides a method of decoding a coded input stream and producing a decoded output stream. The method includes the steps of assigning each successive code in the input stream a dictionary definition that references a location in an output stream, and providing literal codes and reference codes to an output memory such that the reference codes include a source address in the output stream and a length of a code at the source address. In accordance with further embodiments, the method further includes the step of providing the output stream by copying literal codes from a prior location in the output stream to a current location in the output stream.

In accordance with another embodiment, the invention the method includes trhe steps of assigning each of a plurality of codes in an input stream a dictionary definition that references a source address location in an output stream and a length of a code at the source address, providing literal codes in the output stream to an output memory, and providing reference codes in the output stream to the output memory by accessing, for each reference code the length number of codes beginning at the source address location in the output stream.

In accordance with a further embodiment, the invention provides a system for decoding a coded input stream and producing a decoded output stream. The system includes a dictionary assignment unit and an output unit. The dictionary assignment unit is for assigning each successive code in the input stream a dictionary definition that references a location in an output stream. The output unit is for providing literal codes and reference codes to an output memory such that the reference codes include a source address in the output stream and a length of a code at the source address. In accordance with a further embodiment of the invention, the output unit provides the output stream by copying literal codes from a prior location in the output stream to a current location in the output stream.

BRIEF DESCRIPTION OF THE DRAWINGS

The following description may be further understood with reference to the accompanying drawings in which.

The drawings are shown for illustrative purposes only.

DETAILED DESCRIPTION OF THE ILLUSTRATED EMBODIMENTS

The present invention implements a generalized dictionary-based decoding scheme that may be employed for many or all dictionary-based decoder implementations. Systems of the invention may be used for decoding data (e.g., text or image data), data storage, or communication applications. Systems of the invention also decouple output of decoded values from the decoding of dictionary codes. This results in effective pipelining between both processes and reduces memory access bottlenecks. If the decoding process is slower than the output process, then the run-time performance of the overall system is a function of the number of compressed codes in cycles per codebit. This run-time performance scales with compression ratio, i.e., the better the compression, the faster the decompression.

Figure 3:
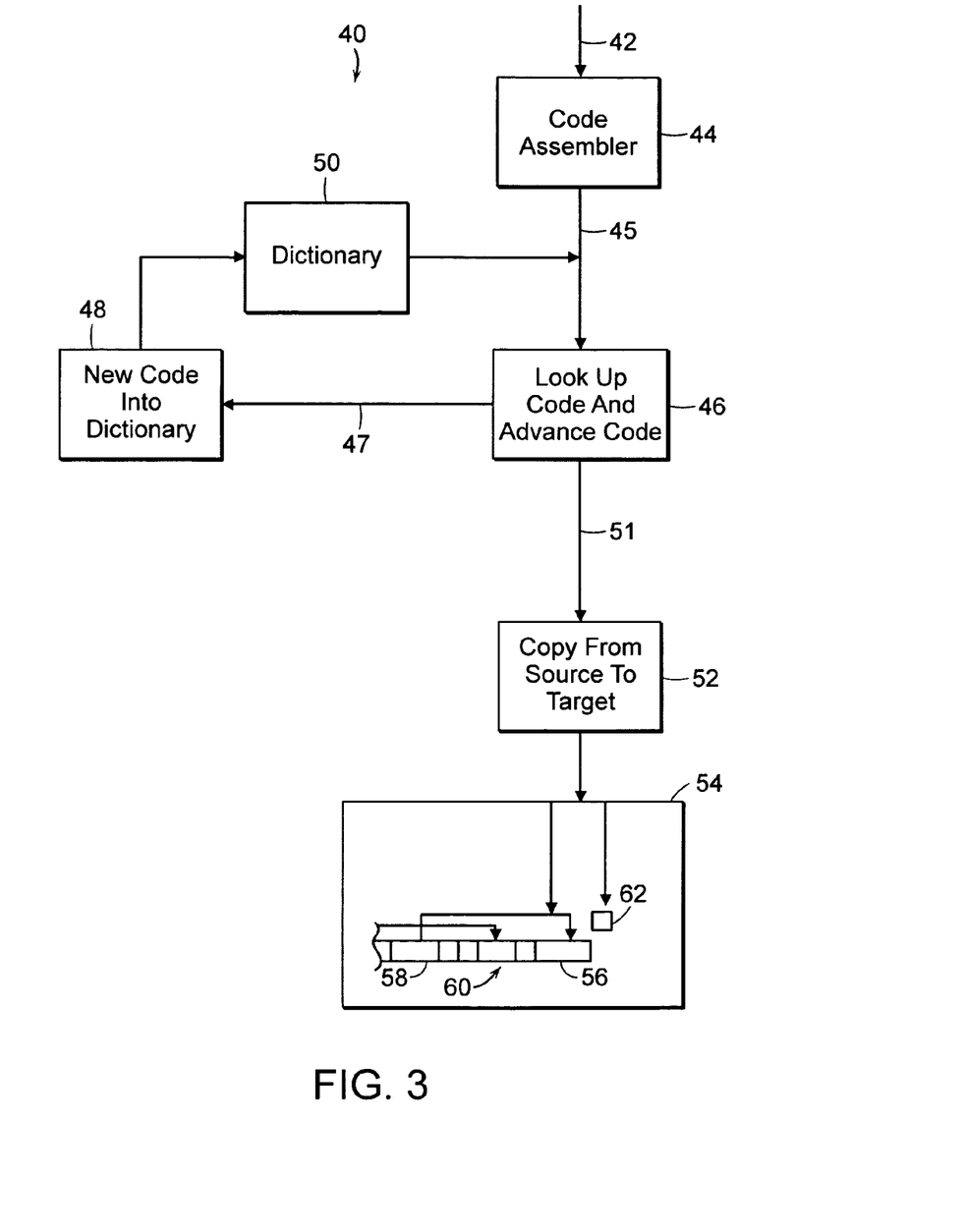
FIG. 3 shows an illustrative diagrammatic functional view of a decoding system in accordance with an embodiment of the invention.

As shown in FIG. 3, a system 40 in accordance with an embodiment of the invention receives an input stream 42 at a code assembler (step 44), which provides a reference code 45. Each new entry 47 is defined (step 48) and added to the dictionary (step 50). The current code is also advanced to a new code (step 46). Each defined reference code 51 (including a source and address length) is provided to the output buffer. In particular, reference codes are copied from a source to a target (step 52) in the output stream 54. As shown in FIG. 3, certain reference codes (e.g., 62) are defined as having their source be the current position in the output stream with a length of one, while other reference codes (e.g., 56) are defined as having the source at a prior location with an associated length (e.g., 58). Further reference codes (e.g., 60) may have been defined as having a prior source (not shown). Each output character (for the text example), therefore, is provided either as a literal code to the current place in the output stream, or is copied from a prior location in the output stream to the current place in the output stream. The use of the output stream for defining the encoded portions avoids the need for a hierarchical tree or other embedded structure that must be traversed to provide the output stream. The output buffer, however, must hold the entire output stream, and all codes within an output stream will be defined within that output stream.

Figure 4A:
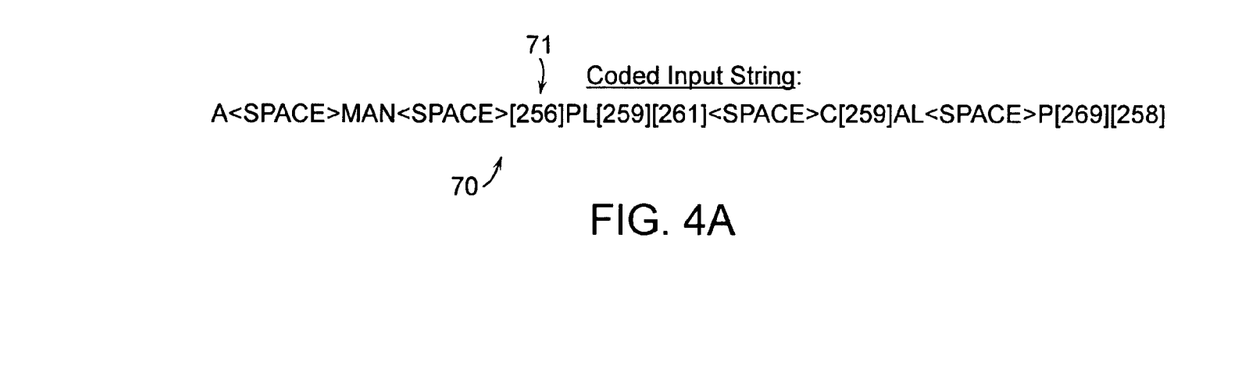
FIGS. 4A–4C show illustrative diagrammatic views of an example of an input code in a first format being decoded by the system of FIG. 3.

For example, as shown in FIG. 4A, an encoded text input stream 70 may be encoded using LZW encoded data (similar to that shown at 30 in FIG. 2A). As each literal code is provide to the output stream, it is assigned a location and length in the output stream. With reference to the table 72 of FIG. 4B for example, each of the literal codes after A, namely <SPACE>, M, A, N and <SPACE> are defined as having a location (256–260 respectively) and a length of 2. When the first encoded data is encountered (e.g., 256), the output operator locates the location 256 and assigns a new code (261) having a length of 2. Rather than storing this in a data structure that must then later be traversed, the output operator simply copies this prior section of the output stream to the current location of the output stream. Although certain later codes may be defined as including previously defined codes (e.g., there may be many levels of embedded coding), the location from which that portion of the output stream is copied includes the actual text, not a reference to another section that must then be looked up.

Figure 4B:
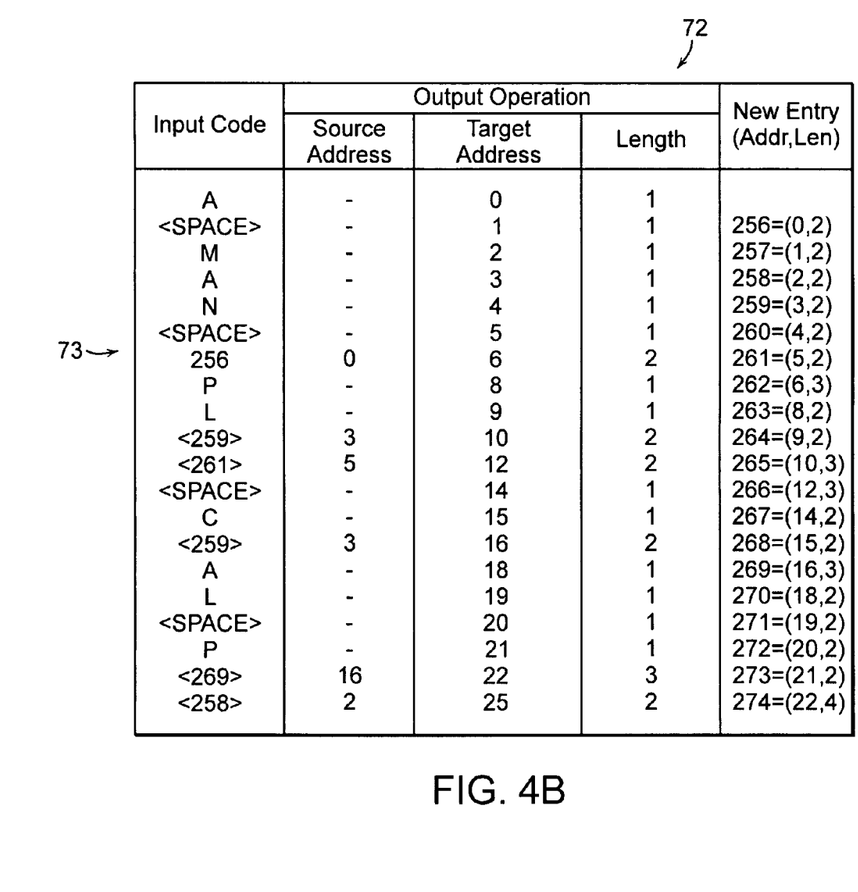
Figure 4C:
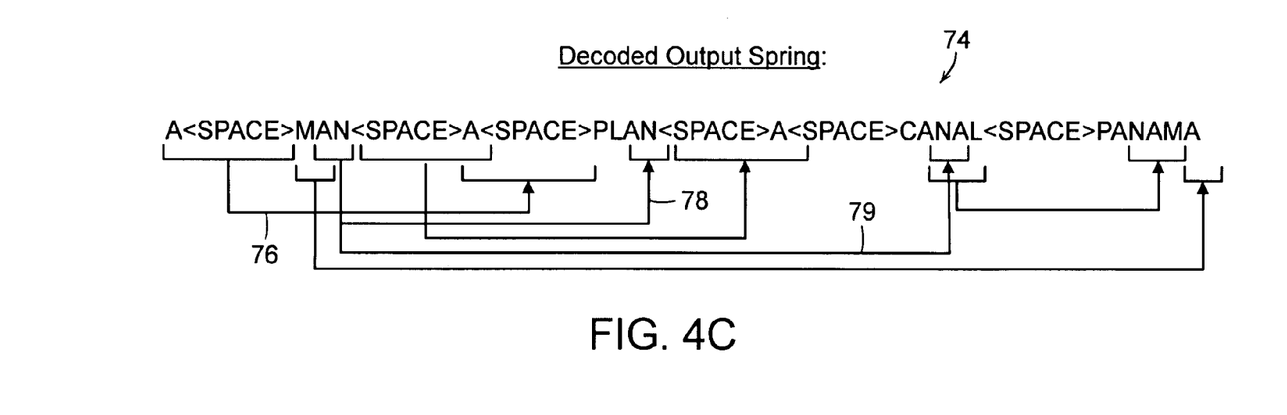

For example, FIG. 4C shows at 74 an exemplary output stream for the input stream 70 in a system of the invention. When the code for "A<SPACE>" (as shown at 71 in FIG. 4A) is encountered at output address 5 (as shown in the table 72 at 73), the system reads back to location zero for two lengths as shown at 76 in FIG. 4C. Later, when the code for "AN" is encountered the system reads back to location 3 for two lengths as shown at 78, and subsequent repetitions of the code for "AN" also read back from the first occurrence (location 3 for two lengths) as shown at 79.

In certain embodiments therefore, systems of the invention produce output decoded values efficiently by a single direct access to the data structure run-time performance. Such systems reduce complexity and storage requirements by simply maintaining address and length for each code. The need for traversal of linked lists is also eliminated, as data is copied from a source location for a specified length from the output buffer itself. The use of a separate data structure such as search tree or history buffer is also avoided as the system used the output buffer itself to store.

Figure 5A:
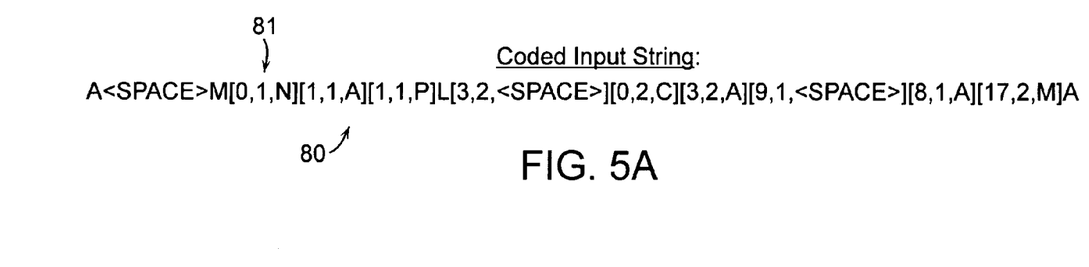
FIGS. 5A–5C show illustrative diagrammatic views of an example of an input code in a second format being decoded by the system of FIG. 3.
Figure 5B:
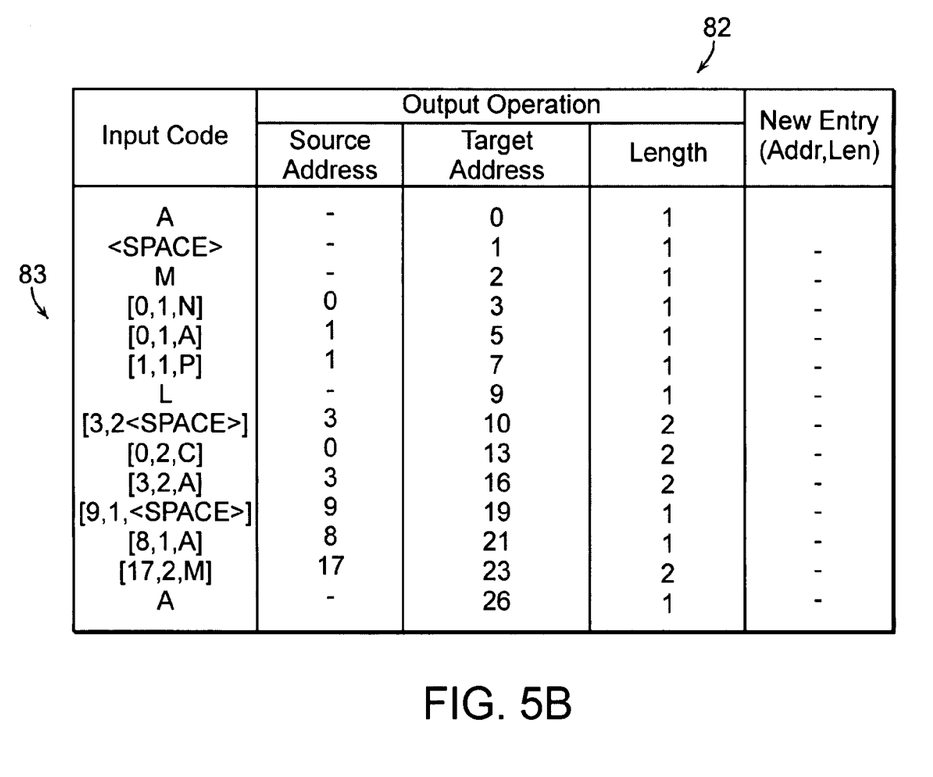
Figure 5C:
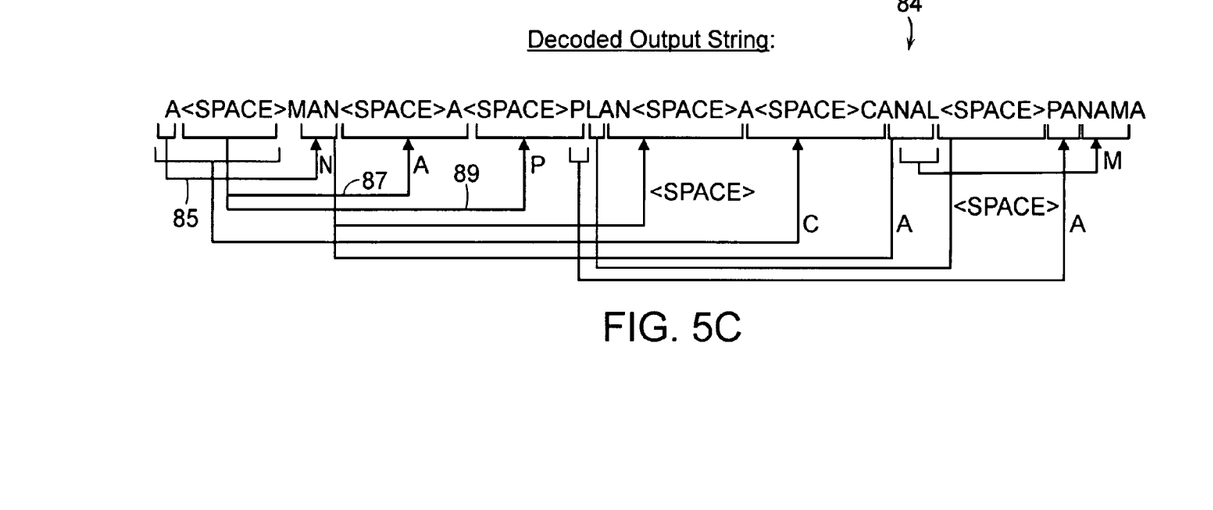

The system may also receive input data that is encoded in a variety of encoding schemes. For example, FIG. 5A shows at 80 the same text as discussed above but encoded in accordance with another encoding technique (called LZ78). Each encoded reference includes a source location, a length, and the character following the repeated string. For example, the fourth reference in the input stream (at location 3) is [0,1,N] as shown at 81 in FIG. 5A. The system finds the source address at 0, a length 1, and assigns the following character as N (as shown at 83 in table 82 in FIG. 5B). The output stream then reads a one length string beginning at location zero, and adds the following character N into the output string as shown at 85 in FIG. 5C. Similarly, the code "<SPACE>A" is copied into the output stream as shown at 87, and the code "<SPACE>P" is copied in to the output stream as shown at 89.

Figure 6A:
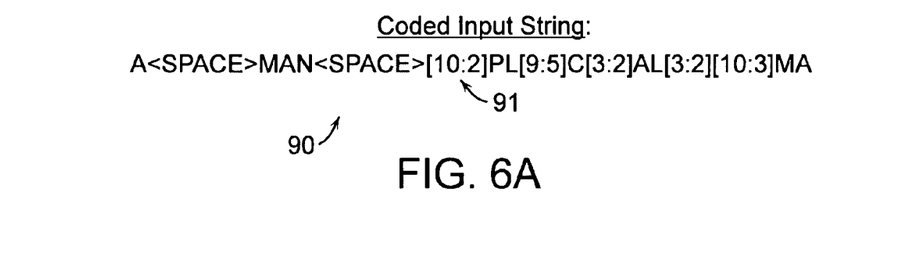
FIGS. 6A–6C show illustrative diagrammatic views of an example of an input code in a third format being decoded by the system of FIG. 3.
Figure 6B:
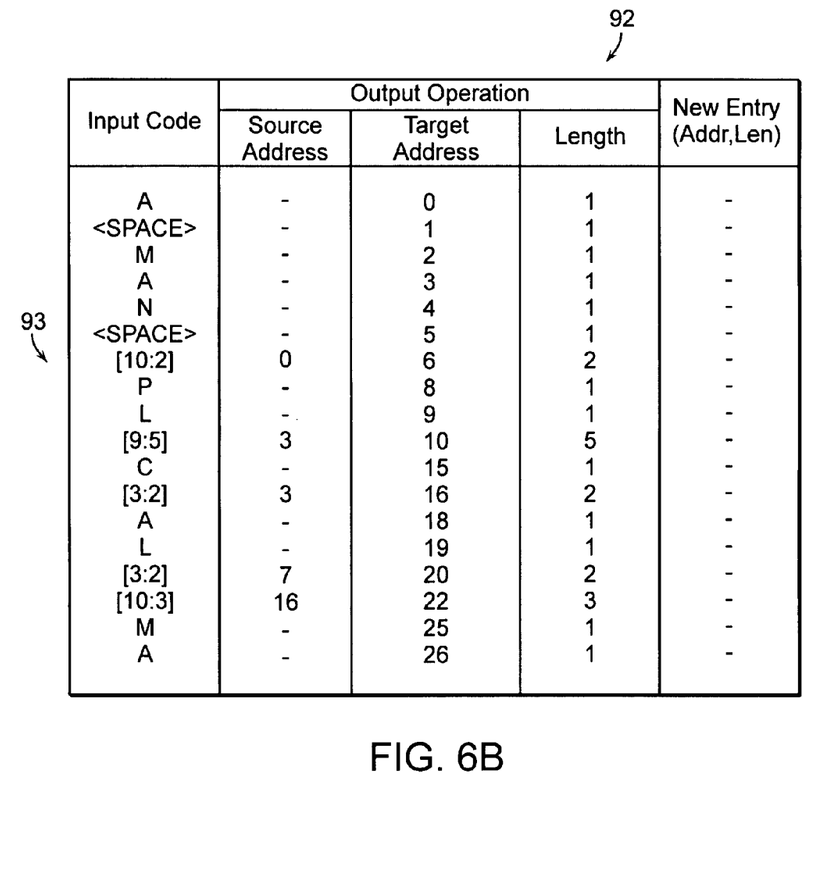
Figure 6C:
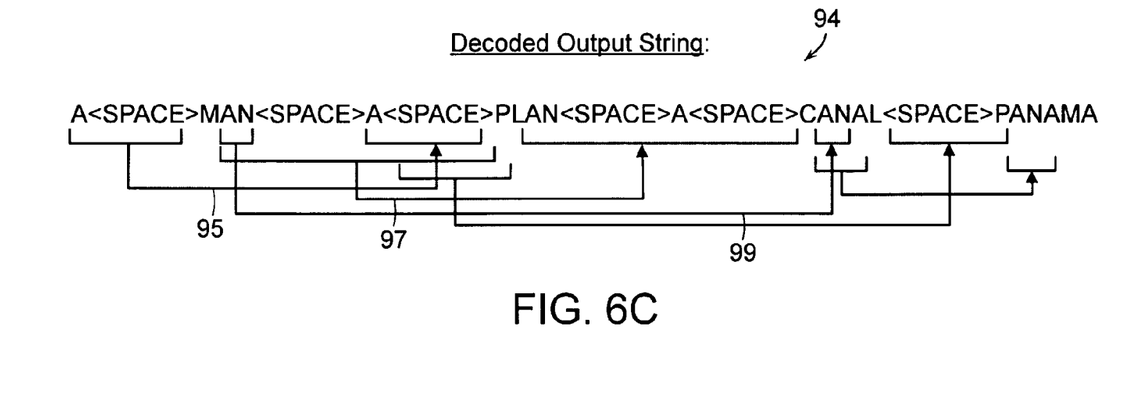

In accordance with a further embodiment, the system may receive an input stream that is encoded in accordance with a further encoding technique. FIG. 6A shows at 90 the same text as discussed above encoded in accordance with another encoding technique (called LZ77). Each encoded reference includes a source location, a length, and the character following the repeated string. The reference codes are translated to source address/length fields from <offset:length>as source addr=<target location>−<fixed window size>+<offset>and length=<length>. For example, the seventh reference in the input stream (at location 6) is [10:2] as shown at 91 in FIG. 6A. The system finds the source address at 10 and a length 2 (as shown at 93 in table 92 in FIG. 6B). The output stream then reads a two length string beginning at location source address into the output string as shown at 95 in FIG. 6C. Similarly, the code "AN<SPACE>A<SPACE>" is copied into the output stream as shown at 97, and the code "AN" is copied in to the output stream as shown at 99.

Those skilled in the art will appreciate that numerous modifications and variations may be made to the above disclosed embodiments without departing from the spirit and scope of the invention.

What is claimed is:

1. A method of decoding a coded input stream and producing a decoded output stream, said method comprising the steps of:
    assigning each successive code in the input stream a dictionary definition that references a location in an output stream; and
    providing literal codes and reference codes to an output memory such that said reference codes include a source address in said output stream and a length of a code at the source address.

2. The method as claimed in claim 1, wherein said method further includes the step of providing said output stream by copying literal codes from a prior location in the output stream to a current location in the output stream.

3. The method as claimed in claim 1, wherein the source address for each reference code includes a literal code.

4. The method as claimed in claim 1, wherein said coded input stream is encoded in accordance with any of a plurality of encoding algorithms.

5. The method as claimed in claim 1, wherein said method operates at an output rate that is substantially the same as the rate of input of the input stream.

6. The method as claimed in claim 1, wherein said method operates at an output rate that is proportional to the amount of compression of the input stream.

7. A method of decoding a coded input stream and producing a decoded output stream, said method comprising the steps of:
    assigning each of a plurality of codes in the input stream a dictionary definition that references a source address location in an output stream and a length of a code at the source address;
    providing literal codes in the output stream to an output memory; and
    providing reference codes in the output stream to the output memory by accessing, for each reference code the length number of codes beginning at the source address location in the output stream.

8. The method as claimed in claim 7, wherein said method further includes the step copying literal codes from a prior location in the output stream to a current location in the output stream.

9. The method as claimed in claim 7, wherein the source address for each reference code includes a literal code.

10. The method as claimed in claim 7, wherein said coded input stream is encoded in accordance with any of a plurality of encoding algorithms.

11. The method as claimed in claim 7, wherein said method operates at an output rate that is substantially the same as the rate of input of the input stream.

12. The method as claimed in claim 7, wherein said method operates at an output rate that is proportional to the amount of compression of the input stream.

13. A system for decoding a coded input stream and producing a decoded output stream, said system comprising:
    dictionary assignment means for assigning each successive code in the input stream a dictionary definition that references a location in an output stream; and
    output means for providing literal codes and reference codes to an output memory such that said reference codes include a source address in said output stream and a length of a code at the source address.

14. The system as claimed in claim 13, wherein said output stream includes portions that are copied from a prior location in the output stream to a later location.

15. The system as claimed in claim 13, wherein the source address for each reference code includes a literal code.

16. The system as claimed in claim 13, wherein said coded input stream is encoded in accordance with any of a plurality of algorithms.

17. The system as claimed in claim 13, wherein said system operates at an output rate that is substantially the same as the rate of input of the input stream.

18. The system as claimed in claim 13, wherein said system operates at an output rate that is proportional to the amount of compression of the input stream.

* * * * *